United States Patent

Hashimoto et al.

Patent Number: 5,821,031
Date of Patent: Oct. 13, 1998

[54] PHOTOSENSITIVE SOLDER RESIST INK, PRINTED CIRCUIT BOARD AND PRODUCTION THEREOF

[75] Inventors: Soichi Hashimoto; Fumito Suzuki; Toshikazu Oda, all of Kyoto, Japan

[73] Assignee: Goo Chemical Co., Ltd., Kyoto, Japan

[21] Appl. No.: 648,002

[22] PCT Filed: Oct. 2, 1995

[86] PCT No.: PCT/JP95/02017

§ 371 Date: May 22, 1996

§ 102(e) Date: May 22, 1996

[87] PCT Pub. No.: WO96/11239

PCT Pub. Date: Apr. 18, 1996

[30] Foreign Application Priority Data

Oct. 5, 1994 [JP] Japan ................... 6-268310

[51] Int. Cl.[6] .............. G03F 7/40; G03F 7/38; G03F 7/038; G03F 7/028
[52] U.S. Cl. ............ 430/280.1; 430/18; 430/311; 430/330; 522/103; 522/101
[58] Field of Search ............... 430/280.1, 18, 430/311, 330; 522/103, 101

[56] References Cited

U.S. PATENT DOCUMENTS 4,933,259  6/1990  Chihara et al. ............ 430/280.1
5,539,064  7/1996  Hashimoto et al. ......... 430/280.1

FOREIGN PATENT DOCUMENTS 1-203424  8/1989  Japan .
4-170480  6/1992  Japan .
5-19470   1/1993  Japan .
6-93221   4/1994  Japan .
6-258830  9/1994  Japan ........................ 430/280
6-271645  9/1994  Japan .

OTHER PUBLICATIONS

Hashimoto et al, 122:42784, Chemical Abstracts, American Chemical Society, English Abstract of JP 06 258830, published 16 Sep. 1994.
Hashimoto et al, 06–258830, Patent Abstract of Japan, English Abstract of JP 06–258830 published 16 Sep. 1994.
Hashimoto et al, 94–335827, World Patents Index, Derwent Information Ltd, English Abstract of JP 06–258830 published 16 Sep. 1994.

*Primary Examiner*—Cynthia Hamilton
*Attorney, Agent, or Firm*—Banner & Witcoff, Ltd.

[57] ABSTRACT

Disclosed herein is a photosensitive solder resist ink capable of development with a dilute alkaline solution. It has a wide pre-curing latitude. It permits the pre-cured board to be stored for a long period of time. It is superior in resolution, sensitivity, and solder resistance. Disclosed also herein is a printed circuit board having good adhesion, chemical resistance, electrical properties, gold plating resistance, solder heat resistance, and electrocorrosion resistance. Disclosed also herein is a process for producing said printed circuit board by using said solder resist ink.

The photosensitive solder resist ink comprises (A) an ultraviolet-curable resin containing 0–20 wt % of aromatic ring moiety which is obtained by reacting a polymer composed of (a) 40–100 mol % of ethylenically unsaturated monomer having an epoxy group and (b) 0–60 mol % of ethylenically unsaturated monomer capable of copolymerization therewith, with (meth)acrylic acid in an amount of 0.7–1.2 equivalents per epoxy equivalent of said polymer and with a saturated or unsaturated polybasic acid anhydride; (B) an epoxy compound soluble in a diluent; (C) a photopolymerization initiator; and (D) a diluent.

16 Claims, No Drawings

PHOTOSENSITIVE SOLDER RESIST INK, PRINTED CIRCUIT BOARD AND PRODUCTION THEREOF

FIELD OF THE INVENTION

The present invention relates to a photosensitive solder resist ink which is ultraviolet-curable and heat-curable and is capable of development with a dilute alkaline solution, a printed circuit board produced by using said resist ink, and a process for producing said printed circuit board.

BACKGROUND OF THE INVENTION

Changes have recently taken place in the process of forming resist patterns on printed circuits boards for domestic and industrial uses to cope with the ever-increasing wiring density on printed circuit boards. The conventional screen printing process is being replaced by the process based on dry film or photoresist ink on account of its good resolution and dimensional accuracy.

Among these resist inks, the photosensitive solder resist inks (which are generally called liquid photosensitive solder resist inks) are disclosed in Japanese Patent Publication No. 40329/1981 and Japanese Patent Laid-open No. 243869/1986. The first one is a composition containing as the essential ingredient an ultraviolet-curable resin formed by reaction of an unsaturated monocarboxylic acid with and simultaneous addition of a polybasic acid anhydride to an epoxy resin. The second one is capable of development with a dilute alkaline solution. It contains an ultraviolet-curable resin (soluble in a dilute alkaline solution) which is formed by addition of an acid anhydride to a novolak-type epoxy acrylate, a photopolymerization initiator, a diluent, and a thermosetting ingredient of epoxy compound.

Of the above-mentioned solder resist inks, the second one is used particularly for high-quality domestic and industrial products because, on curing with UV light and heating, it yields a solder resist having good physical properties.

As mentioned above, the solder resist ink contains an ultraviolet-curable resin and a thermosetting epoxy compound. The former contains carboxylic acids (originating from polybasic acid anhydride) in an amount sufficient for it to be developed with a dilute alkaline solution. The latter functions (by heat-curing) to react with the carboxyl group and increase the crosslink density of the solder resist, so that the resulting solder resist has good thermal and chemical stability and good resistance to soldering heat, chemicals, electrocorrosion, and gold plating.

To form a resist pattern on a board, the above-mentioned resist ink is applied to a board by dipping, spraying, spin coating, roll coating, curtain coating, or screen printing et al. The coating film of the resist ink is pre-cured at 60°–120° C. so as to evaporate the diluent (an organic solvent). The dried coating film is irradiated with UV light through a negative mask of desired pattern placed thereon directly or indirectly. (The source of UV light may be a chemical lamp, low-, medium-, high-, or ultrahigh-pressure mercury lamp, xenon lamp, or metal halide lamp.) After irradiation, the resist film undergoes development so that a desired pattern is formed. Finally, the resist film is heated at 120°–180° C. for about 30 minutes so as to cure the epoxy compound. This curing improves the resist film in strength, hardness, and chemical resistance.

The pre-curing is an important step which makes the coating layer of the resist ink non-sticky, thereby permitting the negative mask to be mounted and demounted and protecting it from staining. In the case where the resist ink contains an epoxy compound, the pre-curing also heat-cures the epoxy compound through the reaction with the carboxyl group present in the ultraviolet-curable resin. This leads to poor development and poor resolution. This trouble is liable to occur in the case where the epoxy compound is a general-purpose solvent-soluble epoxy resin. Therefore, the pre-curing has to be carried out under mild conditions, say, at 80° C. for 30 minutes or less (preferably 20 minutes or less). (In the following, the term "pre-curing latitude" is used to denote the pre-curing conditions necessary for good development and resolution.)

A probable reason for the reaction between the carboxyl group and the epoxy group is that the ultraviolet-curable resin and the solvent-soluble epoxy compound in the resist ink are so compatible that they become homogeneous during the film-forming process and become a uniform mixture in the dried coating film. Therefore, in the case that a content of the solvent-soluble epoxy compound become higher in the resist ink, the ultraviolet-curable resin is diluted therewith to a lower concentration to become poor in sensitivity. Under the above-mentioned mild pre-curing conditions, the diluent (organic solvent) tends to remain in the dried coating film, causing stains in the pattern mask and making it difficult for the pattern mask to be removed from the dried coating film. It is common practice in the actual manufacturing process of printed-circuit boards to store pre-cured boards for a few days and subsequently send them to the exposure step. In the case where the above-mentioned resist ink is used, storage leads to poor development and poor resolution because curing by the epoxy compound proceeds to some extent during storage even at room temperature.

To address this problem a liquid photosensitive solder resist ink has been disclosed in Japanese Patent Laid-open Nos. 141904/1989, 250012/1991, and 217252/1992. It comprises (1) an ultraviolet-curable resin formed by addition of an acid anhydride to bisphenol-A type (or novolak-type) epoxy acrylate and (2) triglycidyl isocyanurate (as an epoxy compound) in the form of fine powder slightly soluble in a diluent. It is capable of development with a dilute alkaline solution.

This photoresist ink offers some advantages. That is, it is less liable to the curing reaction because the epoxy compound in the form of fine powder (which is slightly soluble in a diluent) exists inhomogeneously in the coating film at the time of curing. (In other words, the fine powder does not come into close contact with the ultraviolet-curable resin and hence with the carboxyl groups contained therein.) In addition, it poses no problems with decrease in sensitivity at the time of UV light exposure, because the ultraviolet-curable component is localized in high concentrations in the components other than the finely divided epoxy compound existing inhomogeneously in the pre-cured coating film. Lastly, the resist film increases in strength, hardness, and chemical resistance upon final heating (for post baking) above the melting point of the epoxy compound.

In the case where the ultraviolet-curable resin is an acid adduct of a novolak-type epoxy acrylate, it is desirable to use an epoxy compound in the form of fine powder which is slightly soluble in a diluent. This practice is useful to ensure the pre-curing latitude. In this case, the heat-curability of the coating film after pre-curing is governed by the particle diameter of the epoxy compound in the form of fine powder. Even though the fine particles of the epoxy compound melt upon heating, they do not become completely mixed with the ultraviolet-curable resin in the dried coating film. This results in a distinct boundary between the epoxy compound and the ultraviolet-curable resin.

One way to address this problem is to reduce the particle diameter of the finely divided epoxy compound which is slightly soluble in the diluent. The reduction of particle diameter that is achieved by mechanical crushing is limited. Therefore, although the finely divided epoxy compound ensures the pre-curing latitude, it does not improve the heat resistance and electrocorrosion resistance satisfactorily.

The advantage of using the finely divided epoxy compound (which is slightly soluble in the diluent) in place of the solvent-soluble epoxy compound is procured when the ultraviolet-curable resin is one which is formed by introducing ultraviolet-curable ethylenic unsaturated groups into a polymer comprised of ethylenic unsaturated monomers and which is soluble in a dilute alkaline solution. Examples of such ultraviolet-curable resins include the following:

A resin based on a styrene-maleic acid copolymer or (meth)acrylic ester-maleic anhydride copolymer, each having hydroxyethyl (meth)acrylate or glycidyl (meth)acrylate pendent therefrom;

A copolymer composed of ethylenically unsaturated monomer (having carboxyl groups), acrylic ester, and styrene, the copolymer having glycidyl (meth)acrylate pendent therefrom; and A polymer composed of ethylenically unsaturated monomer (having epoxy groups), the polymer being reacted with (meth)acrylic acid by addition and then reacted with a polybasic acid anhydride.

Incidentally, the term "(meth)acryl" in this specification means "acryl" and/or "methacryl". Therefore, (meth)acrylic acid means acrylic acid and/or methacrylic acid and (meth)acrylate means acrylate and/or methacrylate.

The above-mentioned ultraviolet-curable resin still involves the problem with its inhomogeneous curing in the eventual solder resist and with its incomplete miscibility with the epoxy compound, like the resist ink based on novolak epoxy acrylate which is capable of development with a dilute alkaline solution.

There is disclosed in Japanese Patent Laid-open No. 95384/1994 a liquid solder resist ink (capable of development with a dilute alkaline solution) which is composed of an ultraviolet-curable resin based on a vinyl monomer and a fine particulate epoxy compound slightly soluble in a diluent. The ultraviolet-curable resin is a styrene-maleic anhydride copolymer with 2-hydroxyethyl acrylate pendent therefrom, and the epoxy compound (which is solid at room temperature and slightly soluble in a diluent) is triglycidyl isocyanurate. This solder resist ink requires a special technique for dispersion and grinding so that it has a high sensitivity for exposure and it undergoes heat curing at an adequate rate during post baking. These properties are necessary for the resist film to have good resistance and reliability. In fact, it is pointed out in the example of said patent that the mere grinding of triglycidyl isocyanurate by a roll mill is not satisfactory.

It is an object of the present invention to provide a photosensitive solder resist ink capable of development with a dilute alkaline solution. This resist ink has a broad pre-curing latitude at the time of use, permits the printed circuit board to be stored for a long period of time after pre-curing, and offers high resolution, high sensitivity, and high solder resistance. In addition, it forms a solder resist having good adhesion to the printed circuit board, good chemical resistance, good gold plating resistance, good electrical properties, good solder heat resistance, and good electro-corrosion resistance.

It is another object of the present invention to provide a printed circuit board and a process for producing it by using the above-mentioned photosensitive solder resist ink. The printed circuit board has good adhesion, good chemical resistance, good gold plating resistance, good electrical properties, good solder heat resistance, and good electro-corrosion resistance.

SUMMARY OF THE INVENTION

The gist of the present invention resides in a photosensitive solder resist ink capable of development with a dilute alkaline solution which comprises:

(A) an ultraviolet-curable resin containing 0–20 wt % of aromatic ring moiety which is obtained by reacting a polymer composed of (a) 40–100 mol % of ethylenically unsaturated monomer having an epoxy group and (b) 0–60 mol % of ethylenically unsaturated monomer capable of copolymerization therewith, with (meth)acrylic acid in an amount of 0.7–1.2 equivalents per epoxy equivalent of said polymer and with a saturated or unsaturated polybasic acid;

(B) an epoxy compound soluble in a diluent;

(C) a photopolymerization initiator; and (D) a diluent.

A. Ultraviolet-Curable Resin

The photosensitive solder resist ink of the present invention contains an ultraviolet-curable resin derived from the polymer which is composed of components (a) and (b). Component (a) is an ethylenically unsaturated monomer containing an epoxy group. This component is intended to introduce epoxy groups into the polymer and make the polymer ultraviolet curable through the ethylenically unsaturated double bonds by addition of (meth)acrylic acid. Therefore, the curability of the ultraviolet-curable resin depends directly on the content in the polymer of the ethylenically unsaturated monomer having an epoxy group. The content should be 40–100 mol % of the total amount of the unsaturated monomer in the polymer. With a content less than 40 mol %, the ultraviolet-curable resin will be poor in curability, sensitivity, and resolution in the pattern-forming step, resulting in a solder resist which is poor in solder heat resistance.

Examples of component (a) include epoxycyclohexyl derivatives of (meth)acrylic acid and alicyclic epoxy derivatives of (meth)acrylate, such as glycidyl (meth)acrylate and (3,4-epoxycyclohexyl)methyl (meth)acrylate. They may be used alone or in combination with one another. Of these examples, glycidyl (meth)acrylate is particularly suitable. When this is incorporated into said polymer in an amount of 60–100 mol % of the total amount of the unsaturated monomers, the resulting solder resist exhibits outstanding solder heat resistance and electrocorrosion resistance.

Component (b) may be any ethylenically unsaturated monomer capable of copolymerization with component (a). It is used as required to control the photocurability of the resin and the physical properties of the cured film. Examples of component (b) include the following:

(Meth)acrylic esters of linear or branched aliphatic or alicyclic (with or without unsaturated bonds in the ring) alcohols, such as methyl (meth)acrylate, ethyl (meth)acrylate, propyl (meth)acrylate, butyl (meth)acrylate, isobutyl (meth)acrylate, t-butyl (meth)acrylate, 2-ethylhexyl (meth)acrylate, n-octyl (meth)acrylate, n-decyl (meth)acrylate, isodecyl (meth)acrylate, lauryl (meth)acrylate, myristyl (meth)acrylate, cetyl (meth)acrylate, stearyl (meth)acrylate, cyclohexyl (meth)acrylate, and isobornyl (meth)acrylate;

Hydroxyethyl (meth)acrylate, methoxyethyl (meth) acrylate, and ethoxyethyl (meth)acrylate;

(Meth)acrylic esters of ethylene glycol, such as diethyleneglycol mono(meth)acrylate, triethyleneglycol mono (meth)acrylate, and methoxydiethylene glycol mono(meth) acrylate;

Propyleneglycol (meth)acrylate, butyleneglycol mono (meth)acrylate, and glycerol mono(meth)acrylate, which are similar to the above compounds;

Aromatic (meth)acrylate, such as benzyl (meth)acrylate;

Acrylamide compounds, such as (meth)acrylamide, N-methyl (meth)acrylamide, N-propyl (meth)acrylamide, N-t-butyl (meth)acrylamide, and diacetone (meth) acrylamide; and Vinylpyrrolidone, acrylonitrile, vinyl acetate, styrene, α-methylstyrene, and vinyl ether.

They may be used alone or in combination with one another. Of these examples, the following are desirable because they permit easy control over the hardness and lipofhilic property of the resin coating film and also over the hardness of the eventually formed resist: (Meth)acrylic esters of linear or branched aliphatic or alicyclic alcohols, hydroxyalkyl (meth)acrylate, alkoxyalkyl (meth)acrylate, and glycerol mono(meth)acrylate.

According to the present invention, the ultraviolet-curable resin should contain the aromatic ring moiety in an amount of 0–20 wt %. With a content in excess of 20 wt %, the ultraviolet-curable resin does not have the satisfactory precuring latitude. Incidentally, the aromatic ring moiety embraces the benzene ring, condensed benzene ring, nonobenzoid aromatic ring, and complex aromatic ring, as defined in "Kagaku Daijiten" (Chemical Encyclopedia), 1st ed., p. 2202, issued by Tokyo Kagaku Dojin, 1989. Aromatic ring is a generic term for rings belonging to aromatic compounds. They are classified into the benzene ring and the other rings, i.e. the condensed benzene ring (a, b as an example), nonbenzoid aromatic ring (c, d as an example) and complex aromatic ring (e, f as an example); any of the other rings above-mentioned, also having more or less π-elections delocalized like the benzene ring, to make thermodynamically-stable ring systems. (a) naphthalene, (b) pyrene ring, (c) tropylium ring, (d) cyclopropenium ring, (e) pyridine ring, (f) pyrrole ring. It precludes any substituents, such as alkyl groups, connected to the ring.

According to the present invention, the ultraviolet-curable resin should preferably have a weight-average molecular weight of 5,000–100,000. The molecular weight affects the solubility of the resin in an alkaline solution which must change abruptly upon exposure so that the object of the present invention (i.e., high sensitivity and high resolution) is achieved. With an average molecular weight higher than 100,000, the resulting resist ink has a low solubility in a dilute alkaline solution even when it is exposed to an extremely small amount of light. In addition, it lacks latitude in solubility in an alkaline solution even in its unexposed state. It follows, therefore, that it readily cures even when it is exposed to a small amount of light leaking from the boundary of the pattern in the negative mask attached to it at the time of exposure. The thus cured part is not easily removed at the time of development. The result is the lack of abrupt change in solubility due to exposure, and this leads to insufficient resolution contrary to the apparent high sensitivity. Conversely, with an average molecular weight lower than 5,000, the resulting resist ink tends to lack sensitivity.

A resist ink having both high sensitivity and high resolution will be obtained in the case where the ultraviolet-curable resin has a weight-average molecular weight in the range of 10,000 to 30,000 and also glycidyl (meth)acrylate is used as the ethylenically unsaturated monomer having an epoxy group (with the amount of glycidyl (meth)acrylate being 60–100 mol % of the total amount of the ethylenically unsaturated monomer).

The above-mentioned polymer can be obtained by any known polymerization process, such as solution polymerization and emulsion polymerization. In case of solution polymerization, a mixture of ethylenically unsaturated monomers, which is composed of component (a) and optional component (b), undergoes polymerization in an organic solvent in the presence of a polymerization initiator. During polymerization, the system is heated and stirred under a nitrogen stream or is refluxed.

The organic solvent for solution polymerization includes ketones (such as methyl ethyl ketone and cyclohexanone), aromatic hydrocarbons (such as toluene and xylene), acetic esters (such as ethyl acetate, butyl acetate, cellosolve acetate, butyl cellosolve acetate, butyl carbitol acetate, and propylene glycol monomethyl ether acetate), and alkyl glycol ethers. They may be used alone or in combination with one another.

The polymerization initiator for solution polymerization includes hydroperoxide (such as diisopropylbenzene hydroperoxide, cumene hydroperoxide, and t-butyl hydroperoxide), dialkylperoxide (such as dicumyl peroxide, 2,5-dimethyl-2,5-di-(t-butylperoxy)-hexane, 1,3-bis-(t-butylperoxyisopropyl)-benzene, t-butylcumylperoxdie, di-t-butylperoxide, and 2,5-dimethyl-2,5-di-(t-butylperoxy)-hexyne-3), diacyl peroxide (such as isobutylyl peroxide, 2,4-dichlorobenzoyl peroxide, lauroyl peroxide, benzoyl peroxide, and acetyl peroxide), ketone peroxide (such as methyl ethyl ketone peroxide, methyl isobutyl ketone peroxide, cyclohexanone peroxide, and acetylacetone peroxide), alkyl perester (such as t-butyl peroxypivalate, t-butyl peroxy-2-ethylhexanonate, t-butyl peroxy-3,5,5-trimethylhexanoate, t-butyl peroxyacetate, and t-butyl peroxybenzoate), peroxydicarbonate (such as diisopropyl peroxydicarbonate, di-2-ethylhexyl peroxydicarbonate, diisopropyl peroxydicarbonate, and di-sec-butyl peroxydicarbonate), and azo compound (such as azobisisobutyronitrile, methyl 2,2'-azobisisobutyrate, azobiscyanovaleronitrile, 1,1'-azobis(cyclohexene-1-carbonitrile), and 2,2'-azobis(2-methyl-N-(2-hydroxyethyl)-propionamide). The initiator also includes those of redox type.

The above-mentioned polymer should have a molecular weight corresponding to that of the ultraviolet-curable resin to be obtained therefrom. Any known chain transfer agent may be used to control the molecular weight.

The amount of the (meth)acrylic acid to be added to the above-mentioned polymer should be 0.7–1.2 equivalents of the amount of the ethylenically unsaturated monomer having an epoxy group in the polymer. With an amount less than 0.7 equivalent, the resulting ultraviolet-curable resin contains an excess amount of epoxy groups, with the result that thermosetting of the resin proceeds even in pre-curing to easily cause development after exposure unsatisfactory. With an amount in excess of 1.2 equivalents, the resulting ultraviolet-curable resin will contain (meth)acrylic acid remaining unreacted, by such an amount as to causes trouble.

Examples of the saturated or unsaturated polybasic acid anhydride include dibasic acid anhydride (such as succinic anhydride, methylsuccinic anhydride, maleic anhydride, citraconic anhydride, glutaric anhydride, itaconic anhydride, phthalic anhydride, tetrahydrophthalic anhydride, methyltetrahydrophthalic anhydride, methylnadic anhydride, hexahydrophthalic anhydride, and methylhexahydrophthalic anhydride) and tri- or poly-basic acid anhydride (such as trimellitic anhydride, pyromellitic anhydride, benzophenonetetracarboxylic anhydride, and methylcyclohexenetetracrboxylic anhydride).

The above-mentioned acid anhydride is intended to give an acid value to the ultraviolet-curable resin and to make it dispersible and soluble in an dilute alkaline solution. The amount of the acid anhydride should preferably be such that the resulting ultraviolet-curable resin has an acid value in the range of 25 to 150. With an acid value lower than 25, the ultraviolet-curable resin is poor in developability. With an acid value higher than 150, the ultraviolet-curable resin gives rise to a solder resist after curing which is poor in electrical properties, electrocorrosion resistance, and water resistance due to residual carboxyl groups. The best result is obtained when the acid value is in the range of 40 to 100.

The addition reaction of the above-mentioned (meth) acrylic acid and saturated or unsaturated polybasic acid anhydride may be carried out by any known process in a solvent solution at 60°–150° C., preferably 80°–120° C., with the aid of a heat polymerization inhibitor (such as hydroquinone and hydroquinone monomethyl ether) and a catalyst which includes tertiary amines (such as benzyldimethylamine and triethylamine), quaternary ammonium salts (such as trimethylbenzylammonium chloride and methyltriethylammonium chloride), and triphenylstilbene.

The amount of the ultraviolet-curable resin in the photosensitive solder resist of the present invention should preferably be 10–80 wt % of the total amount of the ink components excluding the organic solvent in the diluent, so that the ink has good sensitivity and working properties and the resulting resist has good physical properties.

B. Epoxy Compound Soluble in a Diluent

The diluent-soluble epoxy compound reacts with the carboxyl group in the resist ink upon heat curing. It also increases the crosslink density of the solder resist, thereby improving the eventually formed solder resist in thermal and chemical stability, solder heat resistance, chemical resistance, electrocorrosion resistance, and gold plating resistance.

Incidentally, the conventional technology suffers the disadvantage that the epoxy compound added to the resist ink reacts with the carboxyl group present in the ultraviolet-curable resin even under the pre-curing conditions. This reaction (or heat curing) adversely affects the development and resolution, particularly in the case where the epoxy compound is soluble in the ultraviolet-curable resin and diluent. To avoid this problem it has been common practice to use an epoxy compound in the form of fine powder which is slightly soluble in a diluent.

However, according to the present invention, the diluent-soluble epoxy compound incorporated into the resist ink does not pose the problem with poor development and resolution due to heat curing under the pre-curing conditions, even though it is soluble in the ultraviolet-curable resin and diluent in the ink and also soluble in the ultraviolet-curable resin component having the carboxyl group in the dried coating film. The reason for this is not fully elucidated. It is believed that the diluent-soluble epoxy compound in the dried coating film of resist ink is apparently soluble in the ultraviolet-curable resin, but actually it is insoluble in the level of fine structure and their phases are so separate from each other that they do not react with each other under the pre-curing conditions.

According to the present invention, the epoxy compound in the resist ink is in the phase-separated state in the level of fine structure unlike the epoxy compound in the form of fine powder which is slightly soluble in a diluent. (The latter is limited in particle diameter by the mechanical crushing method employed.) Therefore, the epoxy compound heat-cures in the heat-curing process that follows pre-curing to exhibit good properties regardless of its particle diameter. The resulting solder resist has high film strength and hardness, chemical resistance, gold plating resistance, electrocorrosion resistance, and solder heat resistance.

Incidentally, in the case of a system that employs an epoxy compound in the form of fine powder which is slightly soluble in a diluent, the above-mentioned problem has been approached by reducing the particle diameter as far as possible. However, as mentioned above, this approach is effective in ensuring the pre-cure latitude but is limited in improvement in gold plating resistance and electrocorrosion resistance.

Examples of the diluent-soluble epoxy compound include polyol glycidyl ether compounds (such as bisphenol-A type epoxy resin, bisphenol-F type epoxy resin, phenol novolak epoxy resin, cresol novolak epoxy resin, bisphenol-A type novolak epoxy resin, sorbitol polyglycidyl ether, sorbitan polyglycidyl ether, glycerol polyglycidyl ether, diglycerol polyglycidyl ether, polyglycerol polyglycidyl ether, neopentyl polyglycidyl ether, trimethylolpropane polyglycidyl ether, pentaerythritol polyglycidyl ether, 1,6-hexanediol polyglycidyl ether, ethylene glycol diglycidyl ether, polyethylene glycol diglycidyl ether, propylene glycol diglycidyl ether, polypropylene glycol diglycidyl ether, tetramethylene glycol diglycidyl ether, polytetramethylene glycol diglycidyl ether, and resorcin diglycidyl ether), glycidyl ester compounds (such as glycidyl adipate and diglycidyl o-phthalate), N-glycidyl type epoxy resin, alicyclic epoxy resin (such as "EHPE-3150" from Daicel Chemical Industries, Ltd.), hydrogenated bisphenol-A type epoxy resin, dicycloheptadiene-phenol type epoxy resin, and naphthalene type epoxy resin. Of these examples, aromatic epoxy resins (such as bisphenol-A type epoxy resin, bisphenol-F type epoxy resin, phenol-novolak type epoxy resin, cresol-novolak type epoxy resin, and bisphenol-A novolak type epoxy resin) are desirable.

The amount of the diluent-soluble epoxy compound in the resist ink should preferably in the range of 0.1 to 50 wt %, more preferably 0.1 to 30 wt %, of the total amount of the ink components excluding the organic solvent in the diluent incorporated into the resist ink, so that the above-mentioned effects are produced as intended.

C. Photopolymerization Initiator

Examples of the photopolymerization initiator used in the present invention include benzoin and alkyl ether thereof (such as benzoin, benzoin methyl ether, benzoin ethyl ether, and benzoin isopropyl ether), acetophenones (such as acetophenone, 2,2-dimethoxy-2-phenylacetophenone, 2,2-diethoxy-2-phenylacetophenone, 1,1-dichlorophenone, and 1-hydroxycyclohexylphenyl ketone), anthraquinones (such as 2-methylanthraquinone and 2-aminoanthraquinone), thioxanthones (such as 2,4-dimethylthioxanthone, 2,4-diethylthioxantone, 2-chlorothioxanthone, 2,4-diisopropylthioxanthone, and 1-chloro-4-propoxy-thioxanthone), ketals (such as acetophenonedimethylketal and benzyldimethylketal), benzophenones (such as benzophenone, 3,3-dimethyl-4-methoxybenzophenone, 3,3',4,4'-tetra-(t-butylperoxycarbonyl)benzophenone, xanthones, and 4-benzoyl-4'-methyldiphenylsulfide), nitrogen-containing compounds (such as 2-methyl-1-[4-(methylthio)phenyl]-2-morpholinopropan-1-one, 2-benzoyl-2-dimethylamino-1-(4-morpholinophenyl)-butanone-1,4,4'-bis-diethylaminobenzophenone), and 2,4,6-trimethylbenzoyldiphenylphosphine oxide. They may be used in combination with any known photopolymerization accelerator and sensitizer, including those derived from benzoic acid or tertiary amine (such as ethyl p-dimethylaminobenzoate, isoamyl p-dimethylamino-benzoate, 2-dimethylaminoethylbenzoate). The above-mentioned photopolymerization initiators may be used alone or in combination with one another.

It is possible to select a combination of imidazolyl dimer and a cyclic ketone having an aminophenyl group, a combination of a polycyclic quinone and a tertiary amine, or a combination of a merocyanine and a triazine derivative. It is also possible to select a photopolymerization initiator and sensitizer such as a borate complex of cation dye. Such combined use makes the resist ink of the present invention curable with visible light or near infrared rays. The scope of the present invention covers those resist inks which contain such an initiator or sensitizer so long as they are curable with ultraviolet light. The above-mentioned initiators are useful particularly in the case where a visible laser or infrared laser is used for exposure.

The amount of the photopolymerization initiator in the resist ink should preferably be 0.1–30 wt % of the total amount of the ink components excluding the organic solvent in the diluent, so that the resist has balanced curability and physical properties.

D. Diluent

The diluent may be selected from photopolymerizable monomers or organic solvents.

Examples of photopolymerizable monomers include water-soluble monomers (such as 2-hydroxyethyl (meth)acrylate, 2-hydroxypropyl (meth)acrylate, N-vinylpyrrolidone, (meth)acryloylmorpholine, methoxytetraethylene glycol (meth)acrylate, methoxypolyethylene glycol (meth)acrylate, polyethylene glycol di(meth)acrylate, N,N-dimethyl (meth)acryalamide, N-methylol (meth)acrylamide, N,N-dimethylaminopropyl (meth)acrylamide, N,N-dimethylaminoethyl (meth)acrylate, N,N-dimethylaminopropyl (meth)acrylate, and melamine (meth)acrylate), water-insoluble monomers (such as diethylene glycol (meth)acrylate, triethylene glycol di(meth)acrylate, propylene glycol di(meth)acrylate, tripropylene glycol di(meth)acrylate, phenoxyethyl (meth)acrylate, tetrahydrofurfuryl (meth)acrylate, cyclohexyl (meth)acrylate, trimethylolpropane di(meth)acrylate, trimethylolpropane tri (meth)acrylate, pentaerythritol tri(meth)acrylate, pentaerythritol tetra(meth)acrylate, dipentaerythritol penta (meth)acrylate, dipentaerythritol hexa(meth)acrylate, isobornyl (meth)acrylate, cyclopentanyl mono- or di(meth)acrylate, cyclopentenyl mono- or di-(meth)acrylate, and mono-, di-, tri-, or polyester of polybasic acid and hydroxyalkyl (meth)acrylate), and acrylate monomer (such as polyester acrylate and urethane acrylate). These monomers may be used alone or in combination with one another.

Examples of organic solvents include linear, branched, dihydric, or polyhydric alcohols (such as ethanol, propyl alcohol, isopropyl alcohol, butyl alcohol, isobutyl alcohol, 2-butyl alcohol, hexanol, and ethylene glycol), ketones (such as methyl ethyl ketone and cyclohexanone), aromatic hydrocarbons (such as toluene and xylene), petroleum-based aromatic mixed solvent (such as Swasol series (from Maruzen Sekiyu) and Solvesso series (from Exxon Chemical), cellosolves (such as cellosolve and butyl cellosolve), carbitols (such as carbitol and butyl carbitol), propylene glycol alkyl ethers (such as propylene glycol methyl ether), polypropylene glycol alkyl ethers (such as dipropylene glycol methyl ether), acetic esters (such as ethyl acetate, butyl acetate, cellosolve acetate, butyl cellosolve acetate, butyl carbitol acetate, and propylene glycol monomethyl ether acetate), and dialkyl glycol ethers.

The above-mentioned photopolymerizable monomer (which is either water-soluble monomer or water-insoluble monomer) dilutes the polymer, thereby making it suitable for coating, adjusts the acid value, and imparts the photopolymerizability. The above-mentioned organic solvent dissolves and dilutes the polymer, thereby making it suitable for coating, and the resulting solution forms a film after the evaporation of the solvent.

The photopolymerizable monomer as the diluent is not essential for the resist ink. If it is used, its amount should preferably be less than 50 wt % of the total amount of the ink components excluding the organic solvent as the diluent. With its amount in excess of 50 wt %, the resulting film after drying is so sticky that it will stain the patterned negative mask placed directly thereon for exposure.

The above-mentioned organic solvents as the diluent may be used alone or in combination with one another. An adequate one should be selected which evaporates rapidly at the time of pre-curing, without remaining in the coating film after drying. The amount of the organic solvent in the resist ink should preferably be more than 5 wt % of the total amount of the ink components. With an amount less than specified above, the resist ink will present difficulties in coating. An adequate amount should be selected according to the coating method employed.

The photosensitive solder resist ink of the present invention may optionally contain an epoxy compound which is slightly soluble in the diluent in an amount not harmful to electrocorrosion resistance and heat resistance. In addition, the resist ink may also contain one or more compounds including polymeric ones as exemplified below:

Blocked isocyanate, such as tolylene diisocyanate, morpholine diisocyanate, isophorone diisocyanate, and hexamethylene diisocyanate blocked with caprolactam, oxime, or malonic ester;

Amino resin (as a thermosetting component), such as n-butylated melamine resin, isobutylated melamine resin, butylated urea resin, butylated melamine-urea cocondensation resin, and benzoguanamine cocondensation resin;

Ultraviolet-curable epoxy acrylate, such as those which are formed by adding (meth)acrylic acid to bisphenol-A type epoxy resin, phenol novolak type. epoxy resin, cresol novolak type epoxy resin, or alicyclic epoxy resin; These (meth)acrylic acid-added epoxy resins may be further modified by the addition of a saturated or unsaturated polybasic acid anhydride such as maleic anhydride, succinic anhydride, itaconic anhydride, phthalic anhydride, and tetrahydrophthalic anhydride. (These compounds may be crosslinked with a compound having at least two isocyanate groups in the molecule or with a polybasic acid anhydride.)

Copolymers of ethylenically unsaturated monomers, such as styrene-(meth)acrylic acid-(meth)acrylate copolymers; Ultraviolet-curable polymer formed by reacting these copolymers with an ethylenically unsaturated monomer having an epoxy group;

Ultraviolet-curable polymer formed by the addition of (meth)acrylic acid to a vinyl copolymer in which one of the monomer units is an ethylenically unsaturated monomer having an epoxy group; and Polymeric compounds such as styrene-maleic acid resin, diallyl phthalate resin, phenoxy resin, melamine resin, urethane resin, and fluoroplastic.

The above-mentioned resist ink may optionally be incorporated, as required, a variety of additives and a surface active agent or polymeric dispersing agent (for stable dispersion). Examples of additives include epoxy resin hardeners (such as imidazole derivatives, polyamines, guanamines, tertiary amines, quaternary ammonium salts, polyphenols, and polybasic acid anhydrides), epoxy resin cure accelerators, fillers (such as barium sulfate, silicon oxide, talc, clay, and calcium carbonate), coloring agents, leveling agent (such as silicone, acrylate copolymer, and fluorine-based surface active agent), adhesion promoters (such as silane coupling agent), thixotropic agent (such as aerosil), polymerization inhibitors (such as hydroquinone, hydroquinone monomethyl ether, pyrogallol, tertiary butyl catechol, and phenothiazine), halation inhibitor, flame retardant, antifoaming agent, and antioxidant).

The above-mentioned resist ink may be prepared in any known way by mixing the essential components and optional additives using a two-roll mill, ball mill, sand mill, or the like. It is not always necessary to mix all the components at one time; it is possible to premix components A and C and then mix the premix with the remaining components at the time of use.

EXAMPLES

To further illustrate the invention, and not by way of limitation, the following examples are given. In the examples, "parts" and "%" are based on weight unless otherwise indicated and "weight-average molecular weight" is that which is measured by GPC under the following conditions. [Measurement of weight-average molecular weight]

Each sample is dissolved in THF to give a solution containing 10 mg/ml of solids. The amount of each injection is 100 μl.
GPC apparatus: SHODEX SYSTEM 11 (from Showa Denko K.K.)
Columns: SHODEX KF-800P, KF-005, KF-003, and KF-001 arranged in series.
Mobile phase: THF
Flow rate: 1 ml/min
Column temperature: 45° C.
Detector: RI
Conversion: polystyrene

Synthesis Example 1

A four-mouth flask equipped with a reflux condenser, thermometer, stirrer, and glass tube to introduce nitrogen for replacement of the atmosphere, was charged with 70 parts of glycidyl methacrylate, 10 parts of methyl methacrylate, 20 parts of t-butyl methacrylate, 100 parts of carbitol acetate, 0.3 part of lauryl mercaptan, and 3 parts of azobisisobutyronitrile. Polymerization was carried out by heating at 75° C. for 5 hours under a nitrogen stream. There was obtained a 50% solution of copolymer. To this solution was added 0.05 part of hydroquinone, 37 parts of acrylic acid, and 0.2 part of dimethylbenzylamine. Addition reaction was carried out at 100° C. for 24 hours. The reaction product was further reacted with 38 parts of tetrahydrophthalic anhydride and 72 parts of carbitol acetate at. 100° C. for 3 hours. Thus there was obtained a 50% solution of ultraviolet-curable resin (A-1) having a weight-average molecular weight of 22,000. The formulation and physical properties of A-1 are shown in Table 1.

Synthesis Examples 2 to 4

The same procedure as in Synthesis Example 1 was repeated to give ultraviolet-curable resins (A-2) to (A-4) in the form of 50% solution, except that the formulation was changed as shown in Table 1.

Referential Example 1

A four-mouth flask equipped with a reflux condenser, thermometer, stirrer, and glass tube to introduce nitrogen for replacement of the atmosphere, was charged with 40 parts of glycidyl methacrylate, 10 parts of methyl methacrylate, 50 parts of styrene, 100 parts of carbitol acetate, and 2 parts of azobisisobutyronitrile. Polymerization was carried out by heating at 75° C. for 5 hours under a nitrogen stream. There was obtained a 50% solution of copolymer. To this solution was added 0.05 part of hydroquinone, 21 parts of acrylic acid, and 0.2 part of dimethylbenzylamine. Addition reaction was carried out at 100° C. for 24 hours. The reaction product was further reacted with 33 parts of tetrahydrophthalic anhydride and 52 parts of carbitol acetate at 100° C. for 3 hours. Thus there was obtained a 50% solution of ultraviolet-curable resin (B-1) having a weight-average molecular weight of 32,000. The formulation and physical properties of B-1 are shown in Table 1.

Referential Example 2

The same procedure as in Referential Example 1 was repeated to give an ultraviolet-curable resin (B-2) in the form of 50% solution, except that the formulation was changed as shown in Table. 1.

TABLE 1

Ultraviolet-curable resins in Synthesis Examples and Referential Examples

| | | Synthesis Examples | | | | Referential Examples | |
|---|---|---|---|---|---|---|---|
| | | 1 | 2 | 3 | 4 | 1 | 2 |
| | Components (parts) | A-1 | A-2 | A-3 | A-4 | B-1 | B-2 |
| Polymer- | Glycidyl methacrylate | 70 | 80 | 80 | 100 | 40 | 30 |
| ization | Methyl methacrylate | 10 | 10 | | | 10 | 70 |
| | t-butyl methacrylate | 20 | | 10 | | | |
| | Butyl acrylate | | | 10 | | | |
| | Styrene | | 10 | | | 50 | |

TABLE 1-continued

Ultraviolet-curable resins in Synthesis Examples and Referential Examples

|  |  | Synthesis Examples | | | | Referential Examples | |
|---|---|---|---|---|---|---|---|
|  |  | 1 | 2 | 3 | 4 | 1 | 2 |
|  | Lauryl mercaptan | 0.3 | 0.3 | 0.3 | 0.2 |  |  |
|  | Azobisisobutyronitrile | 3 | 3 | 3 | 3 | 2 | 2 |
|  | Carbitol acetate | 100 | 100 | 100 | 100 | 100 | 100 |
|  | mol % of glycidyl methacrylate in the total amount of ethylenically unsaturated monomers | 67.2 | 74.2 | 79.1 | 100 | 32.7 | 23.2 |
| Addition | Hydroquinone | 0.05 | 0.05 | 0.05 | 0.05 | 0.05 | 0.05 |
|  | Acrylic acid | 37 | 43 | 43 | 53 | 21 | 16 |
|  | Tetrahydrophthalic anhydride | 38 | 43 | 34 | 43 | 33 | 16 |
|  | Carbitol acetate | 72 | 83 | 74 | 93 | 52 | 30 |
|  | Dimethylbenzylamine | 0.2 | 0.2 | 0.2 | 0.2 | 0.2 | 0.2 |
| Physical | Weight-average molecular weight | 22,000 | 19,000 | 17,000 | 24,000 | 32,000 | 40,000 |
| properties | Content of ethylenically unsaturated groups* | 2.94 | 3.21 | 3.37 | 3.76 | 1.89 | 1.68 |
|  | wt % of aromatic ring in the ultraviolet-curable resin | 0 | 4.0 | 0 | 0 | 24 | 0 |
|  | Acid value | 80 | 85 | 71 | 81 | 79 | 45 |

Referential Example 3

In 60 parts of carbitol acetate was dissolved with heating 214 parts of Epicron N-680 (cresol novolak epoxy resin, having an epoxy equivalent of 214, from Dainippon Ink and Chemicals, Inc.). To the resulting solution was added 74 parts of acrylic acid, 0.1 part of hydroquinone, and 0.7 part of benzyldimethylamine. Reaction was carried out with stirring in the usual way at 90°–100° C. for 24 hours. To the reaction liquid was added 95 parts of carbitol acetate. After stirring, the solution was cooled. Thus there was obtained a 65% solution of epoxy acrylate (C-1).

Examples 1 to 6 and Comparative Examples 1 to 4

A liquid photosensitive solder resist ink (capable of development with a dilute alkaline solution) was prepared from the components shown in Tables 2 and 3 by mixing using a three-roll mil. Incidentally, Epicron N-695, EPPN-502H, EXA-7200H, Epikote 828, and Denacol EX-212 were each dissolved in 3 parts of carbitol acetate prior to mixing.

TABLE 2

Formulation of Resist Ink

| Components (parts) | Examples | | | | | |
|---|---|---|---|---|---|---|
|  | 1 | 2 | 3 | 4 | 5 | 6 |
| Solution of ultraviolet-curable resin (A-1) | 50 |  |  |  | 50 |  |
| Solution of ultraviolet-curable resin (A-2) |  | 50 |  | 50 |  |  |
| Solution of ultraviolet-curable resin (A-3) |  |  | 50 |  |  | 50 |
| Solution of ultraviolet-curable resin (A-4) |  |  |  | 50 |  |  |
| Solution of ultraviolet-curable resin (B-1) |  |  |  |  |  |  |
| Solution of ultraviolet-curable resin (B-2) |  |  |  |  |  |  |
| Solution of epoxy acrylate (C-1) | 6 | 7 | 7 | 7 |  |  |
| Dipentaerythritol hexaacrylate | 5 | 4 | 4 | 4 | 4 | 4 |
| Carbitol acetate | 3 | 3 | 3 | 3 | 3 | 3 |
| Epicron N-695 *2 | 10 |  |  | 8 |  | 8 |
| EPPN-502H *3 |  | 9 |  |  | 7 |  |
| EXA-7200H *4 |  |  | 11 |  |  |  |
| Epikote 828 *5 |  |  |  | 2 |  |  |
| Denacol EX-212 *6 |  |  |  |  | 2 | 2 |
| YX 4000 *7 |  |  |  |  |  |  |
| TEPIC-S *8 |  |  |  |  |  |  |
| Irgacure 907 *9 | 4 | 4 | 4 | 4 | 4 | 4 |
| Kayacure ITX *10 | 0.5 | 0.5 | 0.5 | 0.5 | 0.5 | 0.5 |
| Modaflow *11 | 1 | 1 | 1 | 1 | 1 | 1 |
| Silica (average particle diameter = 1 μm) | 10 | 7 | 7 | 10 | 15 | 15 |
| Barium sulfate | 17 | 20 | 20 | 17 | 10 | 10 |
| Melamine | 1 | 1 | 1 | 1.5 | 1 | 1.5 |
| Phthalocyanine green | 0.5 | 0.5 | 0.5 | 0.5 | 0.5 | 0.5 |
| Swasol 1500 *12 |  |  |  |  |  |  |

TABLE 3

Formulation of Resist Ink

| Components (parts) | Comparative Examples | | | |
|---|---|---|---|---|
|  | 1 | 2 | 3 | 4 |
| Solution of ultraviolet-curable resin (A-1) |  |  | 50 |  |
| Solution of ultraviolet-curable resin (A-2) |  |  |  | 50 |
| Solution of ultraviolet-curable resin (A-3) |  |  |  |  |
| Solution of ultraviolet-curable resin (A-4) |  |  |  |  |
| Sotution of ultraviolet-curable resin (B-1) | 50 |  |  |  |
| Solution of ultraviolet-curable resin (B-2) |  | 50 |  |  |
| Solution of epoxy acrylate (C-1) | 6 | 6 | 6 | 6 |
| Dipentaerythritol hexaacrylate | 4 | 4 | 4 | 4 |
| Carbitol acetate | 3 | 3 |  |  |
| Epicron N-695 *2 | 10 |  |  |  |
| EPPN-502H *3 |  |  |  |  |
| EXA-7200H *4 |  | 11 |  |  |
| Epikote 828 *5 |  |  |  |  |
| Denacol EX-212 *6 |  |  |  |  |
| YX4000 *7 |  |  |  | 9 |
| TEPIC-S *8 |  |  |  |  |
| Irgacure 907 *9 | 4 | 4 | 4 | 4 |
| Kayacure ITX *10 | 0.5 | 0.5 | 0.5 | 0.5 |
| Modaflow *11 | 1 | 1 | 1 | 1 |
| Silica (average particle diameter = 1 μm) | 10 | 7 | 10 | 15 |
| Barium sulfate | 17 | 20 | 17 | 10 |
| Melamine | 1 | 1 | 1 | 1 |
| Phthalocyanine green | 0.5 | 0.5 | 0.5 | 0.5 |
| Swasol 1500 *12 |  |  | 3 | 3 |

Note to Tables 2 and 3
*2 . . . Cresol novolak-type epoxy resin, from Dainippon Ink and Chemicals, Inc.
*3 . . . polyfunctional epoxy resin based on tris(hydroxyphenyl)methane, from Nippon Kayaku Co., Ltd.
*4 . . . Dicyclo-type epoxy resin, from Dainippon Ink and Chemicals, Inc.

TABLE 3-continued

Formulation of Resist Ink

| Components (parts) | Comparative Examples | | | |
|---|---|---|---|---|
| | 1 | 2 | 3 | 4 |

*5 . . . Bisphenol-A type epoxy resin, from Yuka Shell Epoxy Co., Ltd.
*6 . . . 1,6-hexanediol diglycidyl ether, from Nagase Kasei Kogyo Co., Ltd.
*7 . . . An epoxy compound having an epoxy equivalent of 195, from Yuka Shell Epoxy Co., Ltd.
*8 . . . An epoxy resin having an epoxy equivalent of 100, from Nissan Chemical Industries, Ltd.
*9 . . . Photopolymerization initiator, from Ciba-Geigy Corp.
*10 . . . Photopolymerization initiator, from Nippon Kayaku Co., Ltd.
*11 . . . Leveling agent, from Monsanto Co.
*12 . . . Aromatic hydrocarbon solvent, from Maruzen Sekiyu Kagaku Co., Ltd.

Performance tests were carried out in the following manner for the samples of resist ink prepared as mentioned above and the specimens of printed circuit boards produced by using the resist ink.

Test for Resist Ink

—Surface stickiness—

The resist ink was applied by screen printing to the entire surface of a copper-clad laminate (composed of a glass-epoxy substrate and a 35 μm thick copper foil). The coating film was pre-cured for solvent evaporation at 80° C. for 10, 20, or 30 minutes as drying time. There were obtained three test pieces, each having a 20 μm thick dried coating film, for each resist ink sample. Using an exposure machine (OCR HMW201GX, from Oak Manufacturing Co., Ltd.), the coating film of resist ink was exposed to ultraviolet rays (150 mJ/cm) through a patterned mask which had been brought into direct close contact with the coating film. The degree of stickiness was evaluated by checking how easily the mask was removed from the resist film. p0 Rating
Good: The resist film permits the mask to be removed easily, without traces left thereon.
Fair: The resist film permits the mask to be removed, with traces left thereon.
Poor: The resist film presents difficulties in removing the mask. Forced removal damages the mask pattern.

—Pre-curing latitude—

The resist ink was applied by screen printing to the entire surface of a copper-clad laminate (composed of a glass-epoxy substrate and a 35 μm thick copper foil). The coating film was pre-cured for solvent evaporation at 80° C. for 10, 20, 30, 40, 50, 60, 70, or 80 minutes as drying time. There were obtained eight test pieces, each having a 20 μm thick dried coating film, for each resist ink sample. The coating film of resist ink was exposed to ultraviolet rays at an adequate dose through a patterned mask which had been brought into direct close contact with the coating film. The exposure was followed by development with a 1% aqueous solution of sodium carbonate. The samples were checked for developability and the developed pattern.
Rating
Good: Development removes the unexposed part of dried coating film easily, giving rise to a sharp pattern.
Fair: Development takes a long time to remove the unexposed part of the dried coating film, being incapable of forming fine patterns.
Poor: Development does not remove the unexposed part, being incapable of forming patterns.

—Number of remaining steps—

The resist ink was applied by screen printing to the entire surface of a copper-clad laminate (composed of a glass-epoxy substrate and a 35 μm thick copper foil). The coating film was pre-cured for solvent evaporation at 80° C. for 20 minutes as drying time. There was obtained one test piece having a 20 μm thick dried coating film, for each resist ink sample. Using an exposure machine (OCR HMW201GX, from Oak Manufacturing Co., Ltd.), the coating film of resist ink was exposed to ultraviolet rays (50 and 150 mJ/cm$^2$) through a step tablet (PHOTOTEC 21 steps, an exposure testing mask made by Hitachi Kasei Kogyo Co., Ltd.) which had been brought into direct close contact with the coating film. The exposure was followed by development with a 1% aqueous solution of sodium carbonate. The samples were checked for the number of remaining steps (which is a measure of sensitivity).

Test for Printed Circuit Board

The printed circuit boards produced by using the resist ink mentioned above were tested for performance. The test pieces were prepared in the following five steps.

(1) Coating: A copper-clad board (composed of a glass epoxy substrate and a 35 μm thick copper foil) was previously patterned by etching. The entire surface of the patterned board was coated with the resist ink by screen printing. In this way the coating layer of the resist ink was formed on the surface of the board.

(2) Pre-curing: The coating step was followed by precuring at 80° C. for 20 minutes for solvent evaporation from the coating layer on the board. There was obtained a 20 μm thick dried coating film.

(3) Exposure: The coating layer was exposed to ultraviolet rays (at an optimum dose) through a patterned mask placed directly thereon. In this way the dried coating film on the board underwent selective exposure.

(4) Development: After exposure, the coating film underwent development with a 1% aqueous solution of sodium carbonate, so that the unexposed part is removed. The cured part of the coating film formed a pattern on the board.

(5) Post baking: The patterned board was heated at 150° C. for 30 minutes, so that the coating film was heat-cured. In this way there was obtained a test piece of printed circuit board.

The thus obtained test piece was tested for performance in the following manner.

—Resolution—

Exposure was performed through a mask having a concentric circular pattern (with both the line width and line intervals being 40 μm), and the specimen was examined for the resulting pattern.
Rating
Good: A sharp pattern was obtained.
Fair: A pattern was formed, with missing parts.
Poor: No patterns were formed.

—Solder heat resistance—

After coating with flux (LONCO 3355-11, a water-soluble flux, made by London Chemical Co., Ltd.), the test piece was dipped in a molten solder bath at 260° C. for 10 seconds. After water washing, the test piece was examined for surface whitening (by visual observation) and for adhesion (by cross-cut peel test using cellophane tape according to JIS D0202).
Rating of whitening
Good: No whitening is noticed.
Fair: Slight whitening is noticed.
Poor: Considerable whitening is noticed.
Rating of adhesion
Good: No peeling.
Fair: Partial peeling.
Poor: Swelling or peeling before cross-cut test.

—Other items—(tested in the usual way)

TABLE 4

Test Results

| Test items | | | | Examples | | | | | |
|---|---|---|---|---|---|---|---|---|---|
| | | | | 1 | 2 | 3 | 4 | 5 | 6 |
| Surface stickiness after pre-curing at drying temperature of 80° C. | Drying time: 10 min | | | good | good | good | good | good | good |
| | Drying time: 20 min | | | good | good | good | good | good | good |
| | Drying time: 30 min | | | good | good | good | good | good | good |
| Pre-curing time latitude at drying temperature of 80° C. | Drying time: 10 min | | | good | good | good | good | good | good |
| | Drying time: 20 min | | | good | good | good | good | good | good |
| | Drying time: 30 min | | | good | good | good | good | good | good |
| | Drying time: 40 min | | | good | good | good | good | good | good |
| | Drying time: 50 min | | | good | good | good | good | good | good |
| | Drying time: 60 min | | | good | good | good | good | good | good |
| | Drying time: 70 min | | | good | good | good | good | good | good |
| | Drying time: 80 min | | | good | good | good | good | good | good |
| Number of remaining steps | Exposure: 50 mJ/cm$^2$ | | | 5 | 5 | 5 | 5 | 5 | 5 |
| | Exposure: 150 mJ/cm$^2$ | | | 8 | 8 | 8 | 9 | 8 | 8 |
| Characteristics of test pieces obtained under optimum exposure conditions | Resolution | | | good | good | good | good | good | good |
| | Pencil hardness | | | 6H | 6H | 6H | 6H | 6H | 6H |
| | Surface gloss | | | good | good | good | good | good | good |
| | Adhesion | | | good | good | good | good | good | good |
| | Soldering heat resistance | Soldering once | Whitening | good | good | good | good | good | good |
| | | | Adhesion | good | good | good | good | good | good |
| | | Soldering 5 times | Whitening | good | good | good | good | good | good |
| | | | Adhesion | good | good | good | good | good | good |
| | Solvent resistance | | | good | good | good | good | good | good |
| | Acid resistance | | | good | good | good | good | good | good |
| | Gold plating resistance | | | good | good | good | good | good | good |
| | Electrocorrosion resistance | | | good | good | good | good | good | good |

TABLE 5

Test Results

| Test items | | | | Comparative Examples | | | |
|---|---|---|---|---|---|---|---|
| | | | | 1 | 2 | 3 | 4 |
| Surface stickiness after pre-curing at drying temperature of 80° C. | Drying time: 10 min | | | good | good | good | good |
| | Drying time: 20 min | | | good | good | good | good |
| | Drying time: 30 min | | | good | good | good | good |
| Pre-curing time latitude at drying temperature of 80° C. | Drying time: 10 min | | | good | good | good | good |
| | Drying time: 20 min | | | good | good | good | good |
| | Drying time: 30 min | | | good | good | good | good |
| | Drying time: 40 min | | | good | good | good | good |
| | Drying time: 50 min | | | poor | poor | good | good |
| | Drying time: 60 min | | | poor | poor | good | good |
| | Drying time: 70 min | | | poor | poor | good | good |
| | Drying time: 80 min | | | poor | poor | good | good |
| Number of remaining steps | Exposure: 50 mJ/cm$^2$ | | | 3 | 3 | 5 | 5 |
| | Exposure: 150 mJ/cm$^2$ | | | 6 | 6 | 8 | 8 |
| Characteristics of test pieces obtained under optimum exposure conditions | Resolution | | | good | fair | good | good |
| | Pencil hardness | | | 5H | 5H | 5H | 5H |
| | Surface gloss | | | good | good | good | good |
| | Adhesion | | | good | good | good | good |
| | Soldering heat resistance | Soldering once | Whitening | good | good | good | good |
| | | | Adhesion | good | fair | good | good |
| | | Soldering 5 times | Whitening | fair | fair | good | good |
| | | | Adhesion | fair | poor | fair | poor |
| | Solvent resistance | | | good | fair | good | good |
| | Acid reslstance | | | good | fair | good | good |
| | Gold plating resistance | | | good | poor | good | good |
| | Electrocorrosion resistance | | | good | poor | fair | good-fair |

INDUSTRIAL APPLICABILITY OF THE INVENTION

The photosensitive solder resist ink capable of development with a dilute alkaline solution, which has been explained above in the present invention, offers several advantages. That is, it has a wide range of precuring latitude. It permits the coated board to be stored for a long period time after pre-curing. It has good resolution and sensitivity. After coating on the board, it gives rise to a solder resist which exhibits good adhesion to the board, good chemical resistance, good gold plating resistance, good electrical properties, good soldering heat resistance, and good electrocorrosion resistance. Owing to these good properties, the solder resist permits the efficient production of uniform high-quality printed circuit boards. Such circuit boards contribute to the reduction of troubles in the electric apparatus provided with them.

What is claimed is:

1. A photosensitive solder resist ink capable of development with a dilute alkaline solution which comprises:

(A) an ultraviolet-curable resin having a weight-average molecular weight of 5,000 to 100,000 and an acid value in the range of 25 to 150 containing 0–20 wt % of an aromatic ring moiety selected from the group consisting of benzene ring, condensed benezene ring, nonobenzoid aromatic ring, and complex aromatic ring, wherein the wt % is based only on the ring moiety and does not include any substituents, wherein said resin is obtained by reacting a polymer composed of (a) 40–100 mol % of ethylenically unsaturated monomer having an epoxy group and (b) 0–60 mol % of ethylenically unsaturated monomer capable of copolymerization therewith, with (meth)acrylic acid in an amount of 0.7–1.2 equivalents per epoxy equivalent of said polymer and with a saturated or unsaturated polybasic acid anhydride;

(B) an epoxy compound soluble in the following (D) diluent;

(C) a photopolymerization initiator; and (D) a diluent.

2. A photosensitive solder resist ink as defined in claim 1, wherein the ethylenically unsaturated monomer having an epoxy group as component (a) in the ultraviolet-curable resin as component (A) is glycidyl (meth)acrylate.

3. A printed circuit board on which a solder resist pattern is formed from the photosensitive resist ink defined in claim 2.

4. A process for treating a printed circuit board which comprises forming on the board a solder resist pattern from the photosensitive resist ink defined in claim 2.

5. A process for producing a printed circuit board as defined in claim 4, which includes the steps of:

(1) applying the photosensitive solder resist ink to a board on which a printed wiring pattern has previously been formed, thereby forming a photosensitive solder resist ink layer on the board, (2) pre-curing the photosensitive solder resist ink layer thereby forming a dried coating film on the board, (3) selectively exposing the dried coating film to light through a patterned mask, (4) developing the exposed film with an alkaline solution, thereby selectively removing unexposed parts of the film and forming a pattern of cured film on the board, and (5) post-baking the patterned film on the board, thereby heat curing the patterned film.

6. A photosensitive solder resist ink as defined in claim 1, wherein the epoxy compound soluble in a diluent as component (B) is an aromatic epoxy resin.

7. A printed circuit board on which a solder resist pattern is formed from the photosensitive resist ink defined in claim 6.

8. A process for treating a printed circuit board which comprises forming on the board a solder resist pattern from the photosensitive resist ink defined in claim 6.

9. A process for producing a printed circuit board as defined in claim 8, which includes the steps of:

(1) applying the photosensitive solder resist ink to a board on which a printed wiring pattern has previously been formed, thereby forming a photosensitive solder resist ink layer on the board, (2) pre-curing the photosensitive solder resist ink layer thereby forming a dried coating film on the board, (3) selectively exposing the dried coating film to light through a patterned mask, (4) developing the exposed film with an alkaline solution, thereby selectively removing unexposed parts of the film and forming a pattern of cured film on the board, and (5) post-baking the patterned film on the board, thereby heat curing the patterned film.

10. A photosensitive solder resist ink as defined in claim 1, wherein the epoxy compound soluble in a diluent as component (B) is at least one epoxy resin selected from the group consisting of bisphenol-A epoxy resin and novolak epoxy resin.

11. A printed circuit board on which a solder resist pattern is formed from the photosensitive resist ink defined in claim 10.

12. A process for treating a printed circuit board which comprises forming on the board a solder resist pattern from the photosensitive resist ink defined in claim 10.

13. A process for producing a printed circuit board as defined in claim 12, which includes the steps of:

(1) applying the photosensitive solder resist ink to a board on which a printed wiring pattern has previously been formed, thereby forming a photosensitive solder resist ink layer on the board, (2) pre-curing the photosensitive solder resist ink layer thereby forming a dried coating film on the board, (3) selectively exposing the dried coating film to light through a patterned mask, (4) developing the exposed film with an alkaline solution, thereby selectively removing unexposed parts of the film and forming a pattern of cured film on the board, and (5) post-baking the patterned film on the board, thereby heat curing the patterned film.

14. A printed circuit board on which a solder resist pattern is formed from the photosensitive resist ink defined in claim 1.

15. A process for treating a printed circuit board which comprises forming on the board a solder resist pattern from the photosensitive resist ink defined in claim 1.

16. A process for producing a printed circuit board as defined in claim 15, which includes the steps of:

(1) applying the photosensitive solder resist ink to a board on which a printed wiring pattern has previously been formed, thereby forming a photosensitive solder resist ink layer on the board,
(2) pre-curing the photosensitive solder resist ink layer, thereby forming a dried coating film on the board,
(3) selectively exposing the dried coating film to light through a patterned mask,
(4) developing the exposed film with an alkaline solution, thereby selectively removing unexposed parts of the film and forming a pattern of cured film on the board, and
(5) post-baking the patterned film on the board, thereby heat curing the patterned film.

* * * * *